(12) United States Patent
Shih

(10) Patent No.: US 11,784,652 B2
(45) Date of Patent: *Oct. 10, 2023

(54) METHOD AND APPARATUS FOR PERFORMING ON-SYSTEM PHASE-LOCKED LOOP MANAGEMENT IN MEMORY DEVICE

(71) Applicant: Silicon Motion, Inc., Hsinchu County (TW)

(72) Inventor: Fu-Jen Shih, New Taipei (TW)

(73) Assignee: Silicon Motion, Inc., Hsinchu County (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/878,042

(22) Filed: Jul. 31, 2022

(65) Prior Publication Data

US 2022/0376694 A1 Nov. 24, 2022

Related U.S. Application Data

(63) Continuation of application No. 17/161,552, filed on Jan. 28, 2021, now Pat. No. 11,444,629.

(Continued)

(51) Int. Cl.
*H03L 7/23* (2006.01)
*H03L 7/085* (2006.01)
(Continued)

(52) U.S. Cl.
CPC ............ *H03L 7/235* (2013.01); *G11C 29/028* (2013.01); *H03L 7/085* (2013.01); *H03L 7/187* (2013.01)

(58) Field of Classification Search
CPC ..... H04L 7/0331; H04L 7/033; G06F 1/3275; G06F 13/1668; G06F 13/1689;
(Continued)

(56) References Cited

U.S. PATENT DOCUMENTS 6,057,739 A 5/2000 Crowley
6,150,891 A 11/2000 Welland
(Continued)

FOREIGN PATENT DOCUMENTS

CN 101106413 A 1/2008
CN 101136631 A 3/2008
(Continued)

*Primary Examiner* — John W Poos
(74) *Attorney, Agent, or Firm* — Winston Hsu

(57) ABSTRACT

A method and apparatus for performing on-system phase-locked loop (PLL) management in a memory device are provided. The method may include: utilizing a processing circuit within the memory controller to set multiple control parameters among multiple parameters stored in a register circuit of a transmission interface circuit within the memory controller, for controlling parameter adjustment of a PLL of the transmission interface circuit; utilizing a trimming control circuit to perform the parameter adjustment of the PLL according to the multiple control parameters, to adjust a set of voltage parameters among the multiple parameters, for optimizing a control voltage of a voltage controlled oscillator (VCO); and during the parameter adjustment of the PLL, utilizing the trimming control circuit to generate and store multiple processing results in the register circuit, for being sent back to the processing circuit, to complete the parameter adjustment of the PLL, thereby achieving the on-system PLL management.

9 Claims, 5 Drawing Sheets

Related U.S. Application Data

(60) Provisional application No. 63/055,891, filed on Jul. 23, 2020.

(51) Int. Cl.
*H03L 7/187* (2006.01)
*G11C 29/02* (2006.01)

(58) Field of Classification Search
CPC .. G06F 1/3225; G06F 3/0679; G06F 12/0246; G11C 29/028; G11C 2029/0409; G11C 7/222; G11C 2207/2254; G11C 16/32; G11C 29/023; G11C 29/52; G11C 2029/0401; G11C 29/022; G11C 29/02; H03L 7/187; H03L 7/235; H03L 2207/06; H03L 7/099; H03L 7/085; H03L 7/0802; H03L 7/093
See application file for complete search history.

(56) References Cited

U.S. PATENT DOCUMENTS

| | | | |
|---|---|---|---|
| 7,446,615 B2 | 11/2008 | Okuda | |
| 8,060,661 B1* | 11/2011 | Wright | G06F 1/22 |
| | | | 710/104 |
| 2005/0081076 A1* | 4/2005 | Okuda | H03L 7/091 |
| | | | 713/600 |
| 2012/0274370 A1* | 11/2012 | Fortier | H04B 17/11 |
| | | | 327/156 |
| 2015/0160689 A1 | 6/2015 | Mylly | |

FOREIGN PATENT DOCUMENTS

| | | |
|---|---|---|
| CN | 107222211 A | 9/2017 |
| CN | 108199710 A | 6/2018 |
| TW | 421908 | 2/2001 |
| TW | 202013896 A | 4/2020 |
| TW | 202017319 A | 5/2020 |

* cited by examiner

METHOD AND APPARATUS FOR PERFORMING ON-SYSTEM PHASE-LOCKED LOOP MANAGEMENT IN MEMORY DEVICE

CROSS REFERENCE TO RELATED APPLICATIONS

This application is a continuation application of U.S. application Ser. No. 17/161,552, filed on Jan. 28, 2021, which claims the benefit of U.S. Provisional Application No. 63/055,891, filed on Jul. 23, 2020. The contents of these applications are incorporated herein by reference.

BACKGROUND OF THE INVENTION

1. Field of the Invention

The present invention is related to memory device control, and more particularly, to a method for performing on-system phase-locked loop (PLL) management in a memory device, and associated apparatus such as the memory device, a controller thereof, an electronic device comprising the memory device, etc.

2. Description of the Prior Art

A memory device may comprise Flash memory for storing data, and the management of accessing the Flash memory is complicated. The memory device may comprise a physical layer (PHY) circuit for purposes of performing communications with a host device. In order to achieve a high data rate such as 10 gigabits per second (Gbps) or above, a phase-locked loop (PLL) having low phase noise capability is typically needed in the PHY circuit. The related art tries to correct some problems such as phase noise, etc., but further problems are introduced. Thus, a novel method and associated architecture are needed for solving the problems without introducing any side effect or in a way that is less likely to introduce a side effect.

SUMMARY OF THE INVENTION

It is therefore an objective of the present invention to provide a method for performing on-system phase-locked loop (PLL) management in a memory device, and to provide associated apparatus such as the memory device, a controller thereof, an electronic device comprising the memory device, etc., in order to solve the above-mentioned problems.

It is another objective of the present invention to provide a method for performing on-system PLL management in a memory device, and to provide associated apparatus such as the memory device, a controller thereof, an electronic device comprising the memory device, etc., in order to enhance the overall performance.

At least one embodiment of the present invention provides a method for performing on-system PLL management in a memory device, where the method is applied to a memory controller of the memory device. The memory device may comprise the memory controller and a non-volatile (NV) memory, and the NV memory may comprise at least one NV memory element (e.g. one or more NV memory elements). The method may comprise: utilizing a processing circuit within the memory controller to set multiple control parameters among multiple parameters stored in a register circuit of a transmission interface circuit within the memory controller, for controlling parameter adjustment of a PLL of the transmission interface circuit, wherein the transmission interface circuit comprises a physical layer (PHY) circuit, and the PHY circuit comprises the PLL, a trimming control circuit and the register circuit, wherein a voltage controlled oscillator (VCO) in the PLL is implemented with a voltage controlled crystal oscillator (VCXO), and the trimming control circuit is arranged to perform trimming control on the PLL, for supporting optimization of the PLL that uses the VCXO, wherein the optimization of the PLL comprises parameter adjustment of the PLL; utilizing the trimming control circuit to perform the parameter adjustment of the PLL according to the multiple control parameters, to adjust a set of voltage parameters among the multiple parameters, for optimizing a control voltage of the VCO, wherein the control voltage corresponds to the set of voltage parameters, and an oscillation frequency of the VCO corresponds to the control voltage; and during the parameter adjustment of the PLL, in response to at least one predetermined condition of the parameter adjustment of the PLL being satisfied, utilizing the trimming control circuit to generate and store multiple processing results in the register circuit, for being sent back to the processing circuit, to complete the parameter adjustment of the PLL, thereby achieving the on-system PLL management of the memory device.

In addition to the above method, the present invention also provides a memory device, and the memory device comprises an NV memory and a controller. The NV memory is arranged to store information, wherein the NV memory may comprise at least one NV memory element (e.g. one or more NV memory elements). The controller is coupled to the NV memory, and the controller is arranged to control operations of the memory device. In addition, the controller comprises a processing circuit that is arranged to control the controller according to a plurality of host commands from a host device, to allow the host device to access the NV memory through the controller. The controller further comprises a transmission interface circuit that is coupled to the processing circuit, and the transmission interface circuit is arranged to perform communications with the host device, where the transmission interface circuit comprises a physical layer (PHY) circuit. The PHY circuit comprises a phase-locked loop (PLL), a trimming control circuit and a register circuit, wherein a voltage controlled oscillator (VCO) in the PLL is implemented with a voltage controlled crystal oscillator (VCXO), and the trimming control circuit is arranged to perform trimming control on the PLL, for supporting optimization of the PLL that uses the VCXO, wherein the optimization of the PLL comprises parameter adjustment of the PLL. The register circuit is arranged to store multiple parameters of the PLL, and store multiple processing results of the parameter adjustment of the PLL, wherein the multiple parameters comprise multiple control parameters. For example, the controller utilizes the processing circuit to set the multiple control parameters, for controlling the parameter adjustment of the PLL; the controller utilizes the trimming control circuit to perform the parameter adjustment of the PLL according to the multiple control parameters, to adjust a set of voltage parameters among the multiple parameters, for optimizing a control voltage of the VCO, wherein the control voltage corresponds to the set of voltage parameters, and an oscillation frequency of the VCO corresponds to the control voltage; and during the parameter adjustment of the PLL, in response to at least one predetermined condition of the parameter adjustment of the PLL being satisfied, the controller utilizes the trimming control circuit to generate and store the multiple processing results in the register circuit, for being sent back to the processing circuit, to complete the parameter adjustment of the PLL, thereby achieving on-system PLL management of the memory device.

According to some embodiments, an associated electronic device is also provided. The electronic device may comprise the above memory device, and may further comprise a host device, and the host device may be coupled to the memory device. The host device may comprise: at least one processor, arranged for controlling operations of the host device; and a power supply circuit, coupled to the at least one processor, arranged for providing power to the at least one processor and the memory device. In addition, the memory device may provide the host device with storage space.

In addition to the above method, the present invention also provides a controller of a memory device, where the memory device comprises the controller and an NV memory. The NV memory may comprise at least one NV memory element (e.g. one or more NV memory elements). In addition, the controller comprises a processing circuit that is arranged to control the controller according to a plurality of host commands from a host device, to allow the host device to access the NV memory through the controller. The controller further comprises a transmission interface circuit that is coupled to the processing circuit, and the transmission interface circuit is arranged to perform communications with the host device, where the transmission interface circuit comprises a physical layer (PHY) circuit. The PHY circuit comprises a phase-locked loop (PLL), a trimming control circuit and a register circuit, wherein a voltage controlled oscillator (VCO) in the PLL is implemented with a voltage controlled crystal oscillator (VCXO), and the trimming control circuit is arranged to perform trimming control on the PLL, for supporting optimization of the PLL that uses the VCXO, wherein the optimization of the PLL comprises parameter adjustment of the PLL. The register circuit is arranged to store multiple parameters of the PLL, and store multiple processing results of the parameter adjustment of the PLL, wherein the multiple parameters comprise multiple control parameters. For example, the controller utilizes the processing circuit to set the multiple control parameters, for controlling the parameter adjustment of the PLL; the controller utilizes the trimming control circuit to perform the parameter adjustment of the PLL according to the multiple control parameters, to adjust a set of voltage parameters among the multiple parameters, for optimizing a control voltage of the VCO, wherein the control voltage corresponds to the set of voltage parameters, and an oscillation frequency of the VCO corresponds to the control voltage; and during the parameter adjustment of the PLL, in response to at least one predetermined condition of the parameter adjustment of the PLL being satisfied, the controller utilizes the trimming control circuit to generate and store the multiple processing results in the register circuit, for being sent back to the processing circuit, to complete the parameter adjustment of the PLL, thereby achieving on-system PLL management of the memory device.

According to some embodiments, the apparatus may comprise at least one portion (e.g. a portion or all) of the electronic device. For example, the apparatus may comprise the memory controller within the memory device. In another example, the apparatus may comprise the memory device. In some examples, the apparatus may comprise the whole of the electronic device. In addition, the memory controller of the memory device can control the operations of the memory device according to the method. For example, the memory device can store data for the host device in response to a host command such as a write command from the host device. The memory device can read the stored data in response to another host command such as a read command from the host device, and provide the host device with the data read from the NV memory. Additionally, the NV memory may comprise one or more NV memory elements (e.g. one or more Flash memory dies, or one or more Flash memory chips).

The present invention method and apparatus can guarantee that the memory device can operate properly in various situations. While high stability and low phase noise can be achieved by implementing the VCO in the PLL with the VCXO, the present invention method and apparatus can optimize a control voltage for controlling the VCO, for example, with aid of an optimization working flow regarding the control voltage of the VCO, in order to guarantee a short settling time and an accurate frequency of the PLL. In addition, the present invention method and apparatus can solve existing problems of the related art without introducing unwanted side effects, or in a way that is less likely to introduce a side effect.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
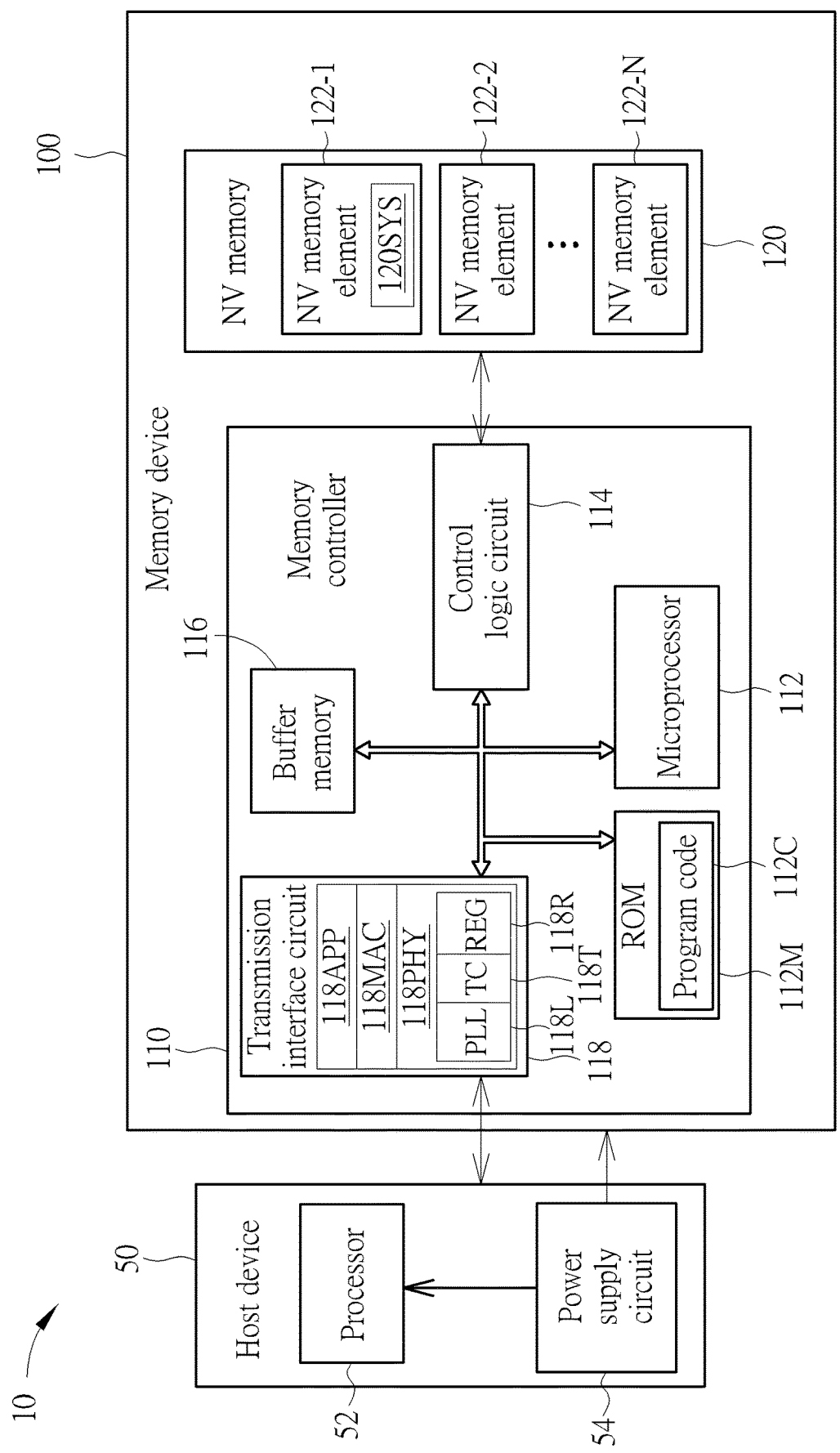
FIG. 1 is a diagram of an electronic device according to an embodiment of the present invention.

FIG. 1 is a diagram of an electronic device 10 according to an embodiment of the present invention, where the electronic device 10 comprises a host device 50 and a memory device 100. The host device 50 may comprises: at least one processor 52 (e.g. one or more processors), arranged to control operations of the host device 50; and a power supply circuit 54, coupled to the aforementioned at least one processor 52, arranged to provide the aforementioned at least one processor 52 and the memory device 100 with power, and output one or more driving voltages to the memory device 100, where the memory device 100 may provide the host device 50 with storage space, and may obtain the one or more driving voltages from the host device 50, to be the power of the memory device 100. Examples of the host device 50 may include, but are not limited to: a multifunctional mobile phone, a tablet computer, and a personal computer such as a desktop computer and a laptop computer. Examples of the memory device 100 may include, but are not limited to: a solid state drive (SSD), and various types of embedded memory devices (e.g. an embedded memory device conforming to the UFS or eMMC specification). According to this embodiment, the memory device 100 may comprise a controller such as a memory controller 110, and may further comprise a non-volatile (NV) memory 120, where the controller such as the memory controller 110 is arranged to access the NV memory 120 for the host device 50, and the NV memory 120 is arranged to store information. The NV memory 120 may comprise at least one NV memory element (e.g. one or more NV memory elements), such as a plurality of NV memory elements 122-1, 122-2, . . . , and 122-N, where "N" may represent a positive integer that is greater than one. For example, the NV memory 120 may be a flash memory, and the plurality of NV memory elements 122-1, 122-2, . . . , and 122-N may be a plurality of flash memory chips (which may be referred to as flash chips) or a plurality of flash memory dies (which may be referred to as flash dies), respectively, but the present invention is not limited thereto.

As shown in FIG. 1, the memory controller 110 may comprise a processing circuit such as a microprocessor 112, a storage unit such as a read only memory (ROM) 112M, a control logic circuit 114, a buffer memory 116, and a transmission interface circuit 118, where at least one portion (e.g. a portion or all) of the above components may be coupled to one another via a bus. The buffer memory 116 is implemented by a random access memory (RAM) (which may be a static RAM (SRAM), for example), where the RAM may be arranged to provide the memory controller 110 with internal storage space (for example, may temporarily store information), but the present invention is not limited thereto. In addition, the ROM 112M of this embodiment is arranged to store a program code 112C, and the microprocessor 112 is arranged to execute the program code 112C to control the access of the NV memory 120. Please note that, the program code 112C may also be stored in the buffer memory 116 or any type of memory. Additionally, the control logic circuit 114 may be arranged to control the NV memory 120. The control logic circuit 114 may comprise an error correction code (ECC) circuit (not shown in FIG. 1), which may perform ECC encoding and ECC decoding, to protect data, and/or perform error correction, and the transmission interface circuit 118 may conform to a specific communications specification (e.g. the Serial Advanced Technology Attachment (SATA) specification, Universal Serial Bus (USB) specification, Peripheral Component Interconnect Express (PCIE) specification, embedded Multi Media Card (eMMC) specification, or Universal Flash Storage (UFS) specification), and may perform communications with the host device 50 according to the specific communications specification.

For better comprehension, the transmission interface circuit 118 may comprise multiple sub-circuits respectively corresponding to multiple layers, such as a physical layer (PHY) circuit 118PHY, a media access control (MAC) layer circuit 118MAC, and an application layer circuit 118APP, and the multiple sub-circuits such as the PHY circuit 118PHY, the MAC layer circuit 118MAC, and the application layer circuit 118APP may be implemented by way of control logic. The PHY circuit 118PHY may comprise a phase-locked loop (PLL) 118L, a trimming control circuit 118T, and a register circuit 118R. In addition, the register circuit 118R may comprise a plurality of registers, and at least one portion (e.g. a portion or all) of these registers may be arranged to store a plurality of parameters of the PHY circuit 118PHY, such as some parameters of the PLL 118L. For example, a voltage controlled oscillator (VCO) (not shown in FIG. 1) in the PLL 118L may be implemented by way of a voltage controlled crystal oscillator (VCXO) rather than a non-crystal oscillator. Using the VCXO is helpful on achieving the high data rate requirement, and may have some pros such as high stability, low phase noise, etc. and some cons such as narrow frequency range, voltage sensitivity, etc. The trimming control circuit 118T can support optimization (e.g. parameter adjustment) of the PLL 118L, to reduce or eliminate unwanted effects due to the VCXO. Under control of the microprocessor 112, the memory device 100 can perform the optimization of the PLL 118L to update one or more parameters (e.g. one or more of the parameters of the PHY circuit 118PHY and/or one or more of the parameters of the PLL 118L) in the register circuit 118R. As a result, the transmission interface circuit 118 can easily operate in a high data rate such as 10 Gbps or above, to enhance the overall performance of the electronic device 10.

In this embodiment, the host device 50 may transmit a plurality of host commands and corresponding logical addresses to the memory controller 110, to access the NV memory 120 within the memory device 100, indirectly. The memory controller 110 receives the plurality of host commands and the logical addresses, and translates the plurality of host commands into memory operating commands (which may be referred to as operating commands, for brevity), respectively, and further controls the NV memory 120 with the operating commands to perform reading or writing/programming upon the memory units or data pages of specific physical addresses within the NV memory 120, where the physical addresses are associated with the logical addresses. For example, the memory controller 110 may generate or update at least one logical-to-physical (L2P) address mapping table (e.g. one or more L2P address mapping tables) to manage the relationships between the physical addresses and the logical addresses. The NV memory 120 may store system information 120SYS, for the memory controller 110 to control operations of the memory device 100. Examples of the system information 120SYS may include, but are not limited to: one or more storage locations (e.g. one or more physical address) of the one or more L2P address mapping tables, one or more parameters of the PHY circuit 118PHY, and one or more parameters of the PLL 118L. When there is a need, the memory controller 110 may load at least one portion (e.g. a portion or all) of the system information 120SYS into the buffer memory 116 or other memories. The system information 120SYS may be located in a predetermined region within the NV memory element 122-1, such as a system region, but the present invention is not limited thereto. In some embodiments, the system information 120SYS may be located in a predetermined region within any of the NV memory elements 122-1, 122-2, . . . , and 122-N, such as a system region.

In addition, the aforementioned at least one NV memory element (e.g. the one or more NV memory elements such as {122-1, 122-2, . . . , 122-N}) may comprise a plurality of blocks, where the minimum unit that the memory controller 110 may perform operations of erasing data on the NV memory 120 may be a block, and the minimum unit that the memory controller 110 may perform operations of writing data on the NV memory 120 may be a page, but the present invention is not limited thereto. For example, any NV memory element 122-$n$ (where "n" may represent any integer in the interval [1, N]) within the NV memory elements 122-1, 122-2, . . . , and 122-N, may comprise multiple blocks, and a block within the multiple blocks may comprise and record specific number of pages, where the memory controller 110 may access a certain page of a certain block within the multiple blocks according to a block address and a page address. For another example, the NV memory element 122-*n* may comprise multiple planes, where a plane may comprise a set of blocks such as the aforementioned multiple blocks, and the memory controller 110 may specify a certain plane within the multiple planes according to a plane number, to access a certain page of a certain block of this plane. As the total number of blocks increases, the storage space of the NV memory 120 may become larger. Regarding manufacturing the NV memory 120, many technologies may be utilized, for example: a 2D/planar NAND flash technology, which may arrange memory cells into a single layer; and a 3D NAND flash technology, which may arrange the memory cells into a vertical stack of multiple layers. According to some embodiments, the NV memory 120 may be implemented as a 2D/planar NAND flash structure with the memory cells arranged in a single layer. According to some embodiments, the NV memory 120 may be implemented as a 3D NAND flash structure with multiple layers of memory cells stacked vertically. In this situation, the storage space of the NV memory 120 may become very large. As the transmission interface circuit 118 can easily operate in a high data rate such as 10 Gbps or above, the memory controller 110 can guarantee the overall performance of the electronic device 10 when accessing a large amount of data in the memory device 100 (e.g. the NV memory 120) is needed.

Figure 2:
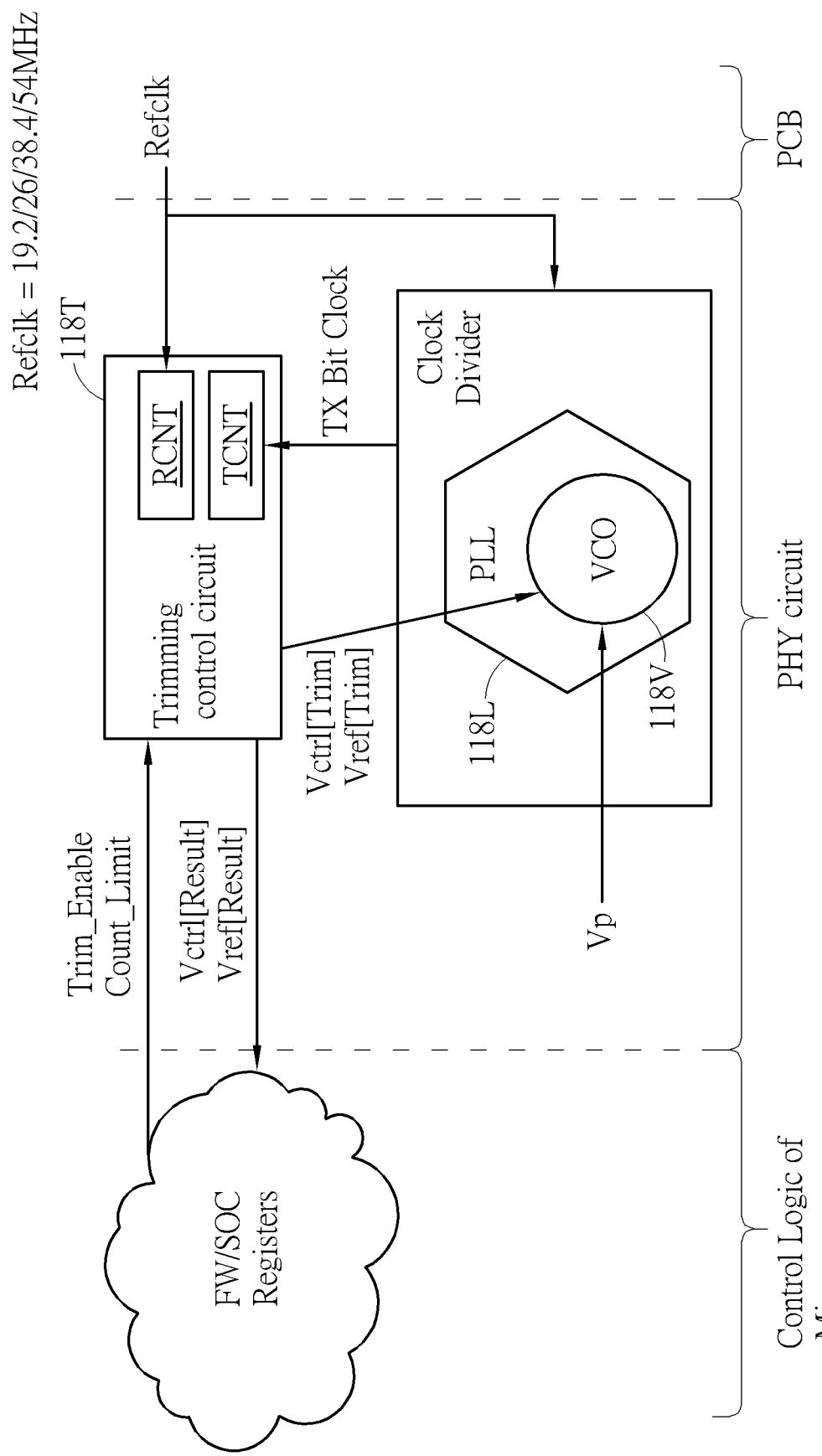
FIG. 2 illustrates a control scheme of a method for performing on-system phase-locked loop (PLL) management in a memory device such as that shown in FIG. 1 according to an embodiment of the present invention.

FIG. 2 illustrates a control scheme of a method for performing on-system phase-locked loop (PLL) management in a memory device such as that shown in FIG. 1 according to an embodiment of the present invention. The memory controller 110 can be configured to perform the on-system PLL management on the PLL 118L, and more particularly, perform associated operations of the control scheme shown in FIG. 2 at any phase (e.g. each phase) of a power-up phase and an adapt equalization phase of the memory device 100. For example, the microprocessor 112 can utilize control logic thereof, such as firmware (FW)/System-on-Chip (SOC) registers within the microprocessor 112, to set some control parameters for controlling the trimming control circuit 118T. For example, the control parameters may comprise a trim-enable parameter Trim_Enable for indicating whether PLL trimming (e.g. PLL parameter adjustment) is enabled, and a count limit Count_Limit for indicating a target of the PLL trimming (e.g. a target count value supposed to be reached during the PLL trimming). In addition, the PHY circuit 118PHY can utilize the register circuit 118R to receive the control parameters such as the trim-enable parameter Trim_Enable, the count limit Count_Limit, etc. for the trimming control circuit 118T, but the present invention is not limited thereto. For example, the PHY circuit 118PHY can utilize the register circuit 118R to store processing results of the PLL trimming, for being sent back to the microprocessor 112 through the FW/SOC registers.

As shown in FIG. 2, a clock divider module (labeled "Clock Divider" for brevity) positioned in the PHY circuit 118PHY and coupled to the trimming control circuit 118T comprises the PLL 118L. The aforementioned VCO in the PLL 118L can be illustrated to be the VCO 118V, and can be implemented by way of the VCXO. Both of the trimming control circuit 118T and the PLL 118L can receive a reference clock Refclk, and the reference clock Refclk can be obtained from a printed circuit board (PCB) of the memory device 100, and more particularly, obtained from the host device 50 through the connection between the host device 50 and the memory device 100, where the memory controller 110 and the NV memory 120 can be implemented by way of one or more chips mounted on the PCB. For example, the reference clock Refclk may have one of multiple predetermined frequencies, such as 19.2 megahertz (MHz), 26 MHz, 38.4 MHz, or 54 MHz (labeled "Refclk=19.2/26/38.4/54 MHz" for better comprehension). In addition, the clock divider module may further comprise a frequency divider (not shown), and utilize the frequency divider to divide a frequency of a PLL output of the PLL 118L to generate a transmission (TX) bit clock. As a result, the TX bit clock carries a divided frequency of the frequency of the PLL output, and the divided frequency is proportional to the frequency of the PLL output.

The PLL 118L can be configured to try locking onto a current frequency (e.g. one of the multiple predetermined frequencies) of the reference clock Refclk. No matter whether the PLL 118L enters a stable state, the TX bit clock carries the divided frequency that is proportional to the frequency of the PLL output. When the trim-enable parameter Trim_Enable indicates that the microprocessor 112 enables the PLL trimming (e.g. the PLL parameter adjustment), the trimming control circuit 118T can be configured to perform trimming control on the PLL 118L (e.g. the VCO 118V) for the microprocessor 112 according to the reference clock Refclk and the TX bit clock. As shown in FIG. 2, the trimming control circuit 118T comprises a reference clock counter RCNT and a TX bit clock counter TCNT respectively corresponding to the reference clock Refclk and the TX bit clock. The trimming control circuit 118T can utilize the reference clock counter RCNT and the TX bit clock counter TCNT to monitor the reference clock Refclk and the TX bit clock, respectively, for example, by counting the respective cycle counts RCount and TCount of the reference clock Refclk and the TX bit clock, respectively.

Please note that an oscillation frequency of the VCO 118V, such as the frequency of the oscillator output of the VCO 118V, typically corresponds to a control voltage of the VCO 118V, which means the oscillation frequency of the VCO 118V can be adjusted by adjusting the control voltage of the VCO 118V. For example, the oscillator output of the VCO 118V can be utilized as the PLL output of the PLL 118L. In addition, the parameters of the PHY circuit 118PHY may comprise a voltage-reference parameter Vref and a voltage-control parameter Vctrl, for fine-tuning the control voltage of the VCO 118V. For example, the VCO 118V can be configured to obtain a power voltage Vp from a power management circuit within the memory device 100 (e.g. within the microprocessor 112), and convert the power voltage Vp into the control voltage of the VCO 118V according to the voltage-reference parameter Vref and the voltage-control parameter Vctrl, for example, by adjusting (e.g. increasing or decreasing) the power voltage Vp with a primary adjustment voltage Vref (e.g. an offset voltage) corresponding to the voltage-reference parameter Vref and/or by adjusting (e.g. increasing or decreasing) the power voltage Vp with a secondary adjustment voltage Vctrl (e.g. a minor voltage) corresponding to the voltage-control parameter Vctrl, where the absolute value of the secondary adjustment voltage Vctrl is typically less than the absolute value of the primary adjustment voltage Vref (e.g. |Vctrl|<|Vref|), and the absolute value of the primary adjustment voltage Vref is typically less than the power voltage Vp (e.g. |Vref|<Vp), but the present invention is not limited thereto.

During performing the trimming control on the PLL 118L (e.g. the VCO 118V), the trimming control circuit 118T can temporarily set the voltage-reference parameter Vref and the voltage-control parameter Vctrl to be their temporary values Vref[Trim] and Vctrl[Trim], respectively. For example, the temporary value Vref[Trim] may represent one of multiple candidate values {Vref[0], Vref[1], . . . } of the voltage-reference parameter Vref, and the temporary value Vctrl [Trim] may represent one of multiple candidate values {Vctrl[0], Vctrl[1], . . . } of the voltage-control parameter Vctrl. When the optimization (e.g. the parameter adjustment) of the PLL 118L is completed, the trimming control circuit 118T can select an optimal candidate value Vref[ ] from the multiple candidate values {Vref[0], Vref[1], . . . } to be a resultant value Vref[Result] of the voltage-reference parameter Vref, and select an optimal candidate value Vctrl [ ] from the multiple candidate values {Vctrl [0], Vctrl [1], . . . } to be a resultant value Vctrl[Result] of the voltage-control parameter Vctrl.

According to some embodiments, the reference clock Refclk can be obtained from an internal clock source of the memory device 100. For example, the internal clock source may be positioned in the memory controller 110, and more particularly, may be positioned outside the PHY circuit 118PHY or positioned outside the transmission interface circuit 118. For another example, the internal clock source may receive the oscillator output of the VCO 118V, and convert the oscillator output into reference clock Refclk by using one or more frequency dividers within the internal clock source.

Figure 3:
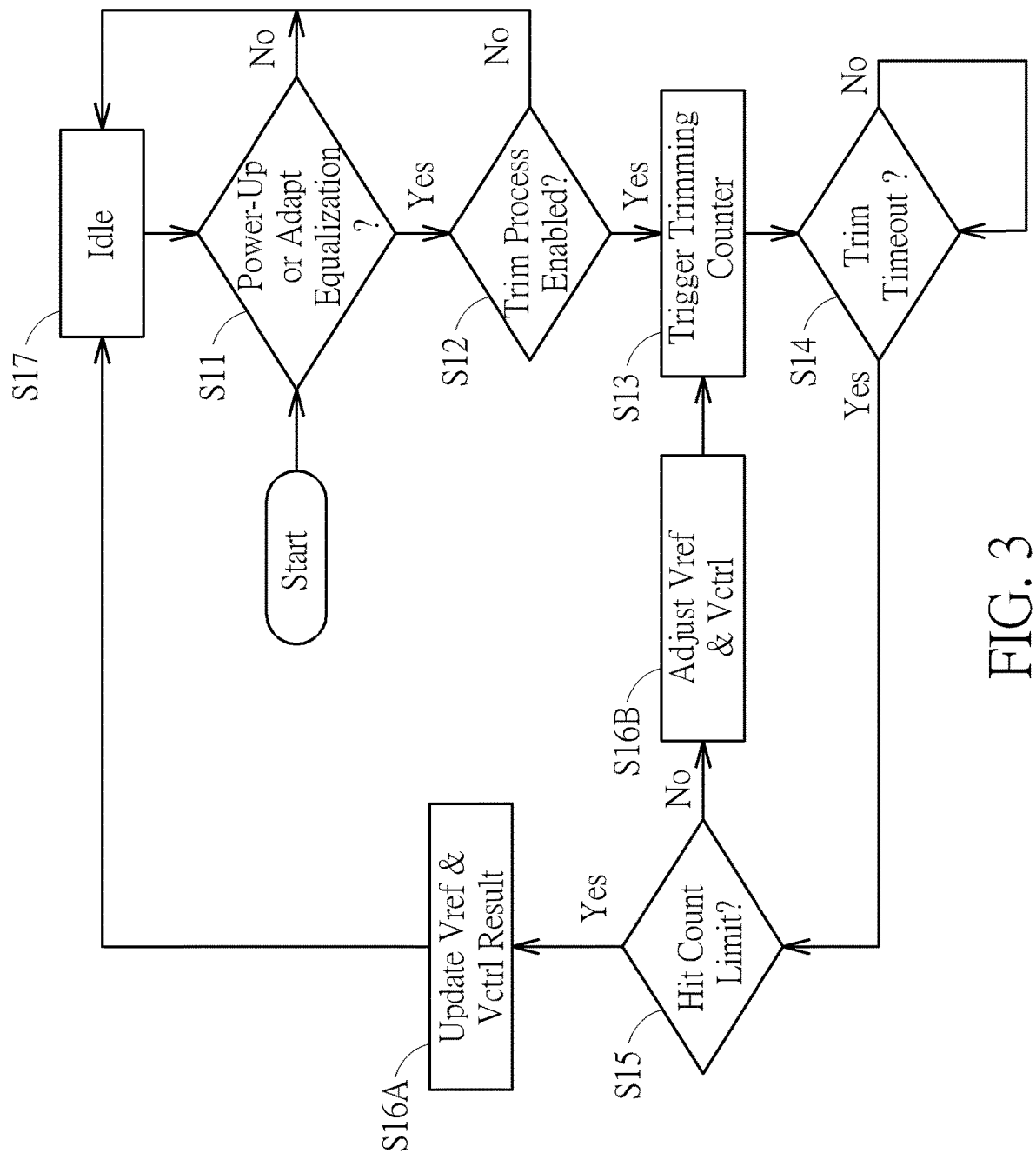
FIG. 3 illustrates a working flow of the method for performing the on-system PLL management in the memory device according to an embodiment of the present invention.

FIG. 3 illustrates a working flow of the method for performing the on-system PLL management in the memory device according to an embodiment of the present invention. The method (e.g. the working flow) can be applied to the memory device 100 shown in FIG. 1, and more particularly, can be applied to the memory controller 110 and the internal components thereof. For example, the on-system PLL management may comprise the PLL trimming and associated control.

In Step S11, the memory controller 110 (e.g. the microprocessor 112 running the program code 112C) can determine whether the memory device 100 is in the power-up phase or the adapt equalization phase (labeled "Power-Up or Adapt Equalization" for brevity). If Yes (e.g. the memory device 100 is in any phase of the power-up phase and the adapt equalization phase), Step S12 is entered; if No, Step S17 is entered. For example, the memory device 100 is just powered up, and therefore is in the power-up phase. For another example, the memory device 100 is arranged to perform adapt equalization (e.g. in response to a power/speed mode change, such as a change of power/speed mode of the connection between the memory device 100 and the host device 50), and therefore is in the adapt equalization phase.

In Step S12, the memory controller 110 (e.g. the trimming control circuit 118T) can determine whether a trim process of the PLL trimming is enabled (labeled "Trim Process Enabled" for brevity). If Yes, Step S13 is entered; if No, Step S17 is entered. According to at least one predetermined rule (e.g. one or more predetermined rules), the microprocessor 112 running the program code 112C can determine whether to enable the PLL trimming (e.g. the trim process thereof) and set the trim-enable parameter Trim_Enable correspondingly. For example, when the memory device 100 is in the power-up phase, or when the memory device 100 is in the adapt equalization phase and the adapt equalization is initial adapt equalization, the microprocessor 112 running the program code 112C can determine to enable the PLL trimming and set the trim-enable parameter Trim_Enable to indicate that the PLL trimming is enabled, so the trimming control circuit 118T can refer to the trim-enable parameter Trim_Enable to determine that the PLL trimming (e.g. the trim process thereof) is enabled. When the memory device 100 is in the adapt equalization phase and the adapt equalization is refresh adapt equalization (e.g. secondary adapt equalization or subsequent adapt equalization) rather than the initial adapt equalization, or when there is an error record (e.g. a record that is recorded by the microprocessor 112, for indicating that an error of a certain type occurs), the microprocessor 112 running the program code 112C can determine to disable the PLL trimming and set the trim-enable parameter Trim_Enable to indicate that the PLL trimming is not enabled, so the trimming control circuit 118T can refer to the trim-enable parameter Trim_Enable to determine that the PLL trimming (e.g. the trim process thereof) is not enabled.

In Step S13, the memory controller 110 (e.g. the trimming control circuit 118T) can trigger a set of trimming counters such as the reference clock counter RCNT and the TX bit clock counter TCNT, to make these trimming counters start counting, and more particularly, control the reference clock counter RCNT and the TX bit clock counter TCNT to count the respective cycle counts RCount and TCount of the reference clock Refclk and the TX bit clock, respectively. For example, the reference clock counter RCNT can increase its counter value such as the cycle count RCount of the reference clock Refclk with an increment of one for each cycle of the reference clock Refclk, starting from an initial value of zero. For another example, the TX bit clock counter TCNT can increase its counter value such as the cycle count TCount of the TX bit clock with an increment of one for each cycle of the TX bit clock during counting, starting from an initial value of zero. Regarding cycle detection of a certain signal such as the reference clock Refclk and the TX bit clock, when both of a transition from the logical low level "0" to the logical high level "1" and a transition from the logical high level "1" to the logical low level "0" of this signal are detected, a cycle of this signal is detected, and therefore the associated counter (e.g. the corresponding counter of the reference clock counter RCNT and the TX bit clock counter TCNT) can increase its counter value with an increment of one, but the present invention is not limited thereto.

In Step S14, the memory controller 110 (e.g. the trimming control circuit 118T) can determine whether a trim timeout condition (labeled "Trim Timeout" for brevity) is satisfied. If Yes, Step S15 is entered; if No, Step S14 is re-entered to wait for the trim timeout condition being satisfied. For example, the trim timeout condition may comprise that the cycle count RCount of the reference clock Refclk reaches a predetermined cycle count threshold such as a timeout count Timeout_Count. As the frequency of the reference clock Refclk is equal to a certain frequency of the multiple predetermined frequencies, the period of the reference clock Refclk is fixed. A product of this period multiplied by the cycle count RCount of the reference clock Refclk may represent the elapsed time of waiting for the trim timeout condition being satisfied, and a product of this period multiplied by the predetermined cycle count threshold (e.g. the timeout count Timeout_Count) may represent a time threshold corresponding to the predetermined cycle count threshold.

In Step S15, the memory controller 110 (e.g. the trimming control circuit 118T) can determine whether the cycle count TCount of the TX bit clock counter TCNT falls within (e.g. hits) a predetermined range such as a target range around the count limit Count_Limit (labeled "Hit Count Limit" for brevity). If Yes (which means the optimization of the PLL 118L is completed), Step S16A is entered; if No, Step S16B is entered. The target range can be the range of an interval [Count_Limit−Count_diff_max, Count_Limit+Count_diff_max], where the maximum count difference Count_diff_max can be a non-negative integer, and more particularly, can be a positive integer. For example, the memory controller 110 (e.g. the trimming control circuit 118T) can calculate the absolute value |TCount−Count_Limit| of the difference (TCount−Count_Limit) between the cycle count TCount and the count limit Count_Limit to be a count difference Count_diff, and determine whether the cycle count TCount falls within (e.g. hits) the predetermined range according to whether the count difference Count_diff is less than or equal to the maximum count difference Count_diff_max. When the count difference Count_diff is less than or equal to the maximum count difference Count_diff_max, the trimming control circuit 118T can determine that the cycle count TCount falls within (e.g. hits) the predetermined range.

In Step S16A, when the optimization (e.g. the parameter adjustment) of the PLL 118L is completed, the memory controller 110 (e.g. the trimming control circuit 118T) can update the voltage-reference parameter Vref and the voltage-control parameter Vctrl with the resultant value Vref[Result] and the resultant value Vctrl[Result], respectively (labeled "Update Vref & Vctrl Result" for better comprehension). For example, the trimming control circuit 118T can select the latest candidate value Vref[ ] of the voltage-reference parameter Vref and the latest candidate value Vctrl[ ] of the voltage-control parameter Vctrl that have just been used in the loop comprising Steps S13-S15 and S16B as the resultant value Vref[Result] of the voltage-reference parameter Vref and the resultant value Vctrl[Result] of the voltage-control parameter Vctrl, respectively, and update the voltage-reference parameter Vref and the voltage-control parameter Vctrl by returning the resultant value Vref[Result] of the voltage-reference parameter Vref and the resultant value Vctrl[Result] of the voltage-control parameter Vctrl to the microprocessor 112.

In Step S16B, the memory controller 110 (e.g. the trimming control circuit 118T) can adjust the voltage-reference parameter Vref and the voltage-control parameter Vctrl. For example, the trimming control circuit 118T can adjust the voltage-reference parameter Vref by selecting another candidate value Vref[ ] of the multiple candidate values {Vref[0], Vref[1], ... } to be the temporary value Vref[Trim], and adjust the voltage-control parameter Vctrl by selecting another candidate value Vctrl[ ] of the multiple candidate values {Vctrl[0], Vctrl[1], ... } to be the temporary value Vctrl [Trim].

In Step S17, the memory controller 110 (e.g. the microprocessor 112 running the program code 112C) can keep the memory device 100 idling (labeled "Idle" for brevity) until any event occurs.

For better comprehension, the method may be illustrated with the working flow shown in FIG. 3, but the present invention is not limited thereto. According to some embodiments, one or more steps may be added, deleted, or changed in the working flow shown in FIG. 3. For example, the state of keeping the memory device 100 idling can be regarded as an idle state of the memory device 100, and the memory device 100 (e.g. the memory controller 110) can leave the idle state in response to the any event and perform associated processing corresponding to the any event. Examples of the any event may include, but are not limited to: the power/speed mode change, and any host command received from the host device 50, such as a write command, a read command, etc. The memory controller 110 can store data into the NV memory 120 for the host device 50 in response to a host command such as the write command from the host device 50, and control the memory device 100 to enter the idle state again after completing the above processing corresponding to the write command (e.g. the operation of writing the data into the NV memory 120). The memory controller 110 can read the stored data from the NV memory 120 in response to another host command such as the read command from the host device 50, and provide the host device 50 with the aforementioned stored data read from the NV memory 120, and control the memory device 100 to enter the idle state again after completing the above processing corresponding to the read command (e.g. the operations of reading the stored data and providing the host device 50 with the aforementioned stored data).

Figure 4:
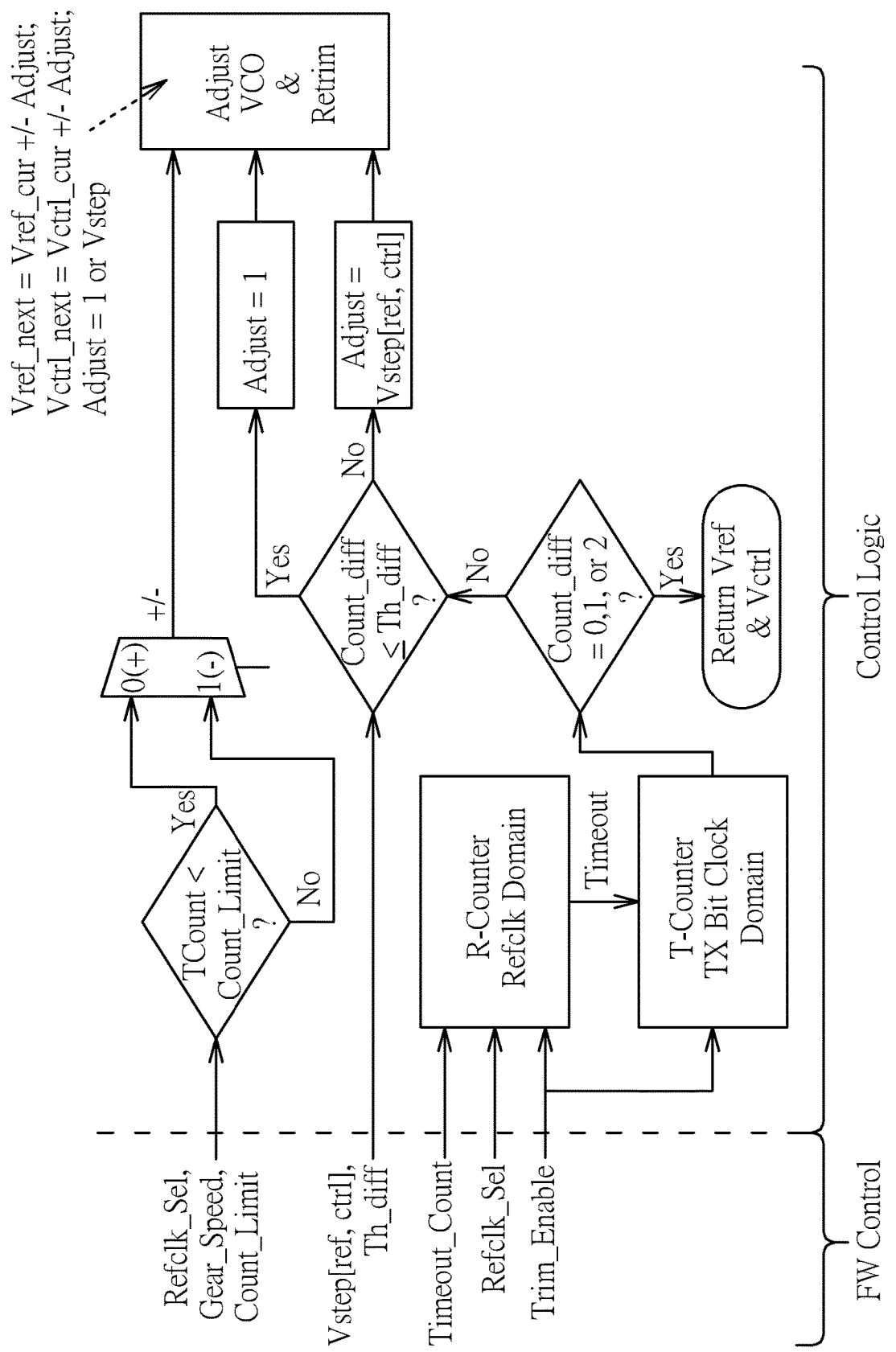
FIG. 4 illustrates some implementation details regarding some operations in the working flow shown in FIG. 3 according to an embodiment of the present invention.

FIG. 4 illustrates some implementation details regarding some operations (e.g. the operations of Steps S13-S15, S16A and S16B) in the working flow shown in FIG. 3 according to an embodiment of the present invention. In addition to the trim-enable parameter Trim_Enable and the count limit Count_Limit, the control parameters for controlling the trimming control circuit 118T may further comprise:

(1) a reference clock selection parameter Refclk_Sel, for selecting one of the multiple predetermined frequencies as the frequency of the reference clock Refclk;

(2) a gear speed Gear_Speed, for selecting one of multiple speed modes (e.g. High Speed (HS) Gears, such as the HS Gear 1, the HS Gear 2, the HS Gear 3 and the HS Gear 4, which may be respectively referred to as HS-GEAR1, HS-GEAR2, HS-GEAR3 and HS-GEAR4 for brevity);

(3) a set of voltage steps Vstep[ref, ctrl], such as Vstep[ref] and Vstep[ctrl], for being utilized as an increment or a decrement for adjusting the voltage-reference parameter Vref and the voltage-control parameter Vctrl, respectively;

(4) a count difference threshold Th_diff, such as a threshold for determining whether to set the respective adjustment steps of the voltage-reference parameter Vref and the voltage-control parameter Vctrl as minor steps such as one or greater steps such as the set of voltage steps Vstep[ref, ctrl], respectively;

(5) the timeout count Timeout_Count mentioned above; and (6) the maximum count difference Count_diff_max mentioned above;

where the control parameters can be determined by the microprocessor 112 running the program code 112C (labeled "FW control" for better comprehension), but the present invention is not limited thereto.

In the operation of Step S14, the trimming control circuit 118T can utilize the reference clock counter RCNT to count the cycle count RCount in a cycle count domain of the reference clock Refclk (labeled "R-Counter Refclk Domain" for brevity), in order to determine whether the trim timeout condition is satisfied. When the trim timeout condition is satisfied (e.g. the case of timeout), in the operation of Step S15, the trimming control circuit 118T can utilize the TX bit clock counter TCNT to count the cycle count TCount in a cycle count domain of the TX bit clock (labeled "T-Counter TX Bit Clock Domain" for brevity), in order to determine whether the optimization of the PLL 118L is completed. For example, in a situation where Count_diff_max=2, the trimming control circuit 118T can determine whether the cycle count TCount falls within (e.g. hits) the predetermined range such as the range of the interval [Count_Limit−2, Count_Limit+2] according to whether the count difference Count_diff is equal to any of {0, 1, 2}. If Yes, Step S16A is entered to return the respective resultant values Vref[Result] and Vctrl[Result] of the voltage-reference parameter Vref and the voltage-control parameter Vctrl to the microprocessor 112 (labeled "Return Vref & Vctrl" for brevity); if No, Step S16B is entered to perform the voltage parameter adjustment, for example, through the operations shown in the upper half of FIG. 4.

If the count difference Count_diff is less than or equal to the count difference threshold Th_diff, the trimming control circuit 118T can set the respective adjustment steps {Adjust} of the voltage-reference parameter Vref and the voltage-control parameter Vctrl to be the minor steps such as one (labeled "Adjust=1" for brevity); otherwise, the trimming control circuit 118T can set the respective adjustment steps {Adjust} of the voltage-reference parameter Vref and the voltage-control parameter Vctrl to be the greater steps such as the set of voltage steps Vstep[ref, ctrl] (labeled "Adjust=Vstep[ref, ctrl]" for brevity). As shown around the upper left of FIG. 4, the trimming control circuit 118T can determine whether the respective adjustment steps {Adjust} of the voltage-reference parameter Vref and the voltage-control parameter Vctrl should be utilized as an increment or a decrement during the voltage parameter adjustment according to whether the cycle count TCount is less than the count limit Count_Limit. For example, if the cycle count TCount is less than the count limit Count_Limit, the trimming control circuit 118T can determine that the respective adjustment steps {Adjust} of the voltage-reference parameter Vref and the voltage-control parameter Vctrl should be utilized as an increment, and therefore adjust the voltage-reference parameter Vref and the voltage-control parameter Vctrl by increasing them with the respective adjustment steps {Adjust} (labeled "+" for brevity); otherwise, the trimming control circuit 118T can determine that the respective adjustment steps {Adjust} of the voltage-reference parameter Vref and the voltage-control parameter Vctrl should be utilized as a decrement, and therefore adjust the voltage-reference parameter Vref and the voltage-control parameter Vctrl by decreasing them with the respective adjustment steps {Adjust} (labeled "−" for brevity). As a result, the trimming control circuit 118T can adjust the VCO 118V (more particularly, adjust the control voltage of the VCO 118V by adjusting the voltage-reference parameter Vref and the voltage-control parameter Vctrl, in order to adjust the frequency of the oscillator output of the VCO 118V) and retrim the PLL 118L (labeled "Adjust VCO & Retrim" for brevity) according to the following equations:

$Vref\_next = Vref\_cur +/- Adjust$; and $Vctrl\_next = Vctrl\_cur +/- Adjust$;

where Adjust=1 or Vstep. In the above equations, "Vref_cur" and "Vref_next" may represent the current value and the next value of the voltage-reference parameter Vref, respectively, and "Vctrl_cur" and "Vctrl_next" may represent the current value and the next value of the voltage-control parameter Vctrl, respectively. For example, the trimming control circuit 118T can set Adjust=1 (e.g. set the respective adjustment steps {Adjust} of the voltage-reference parameter Vref and the voltage-control parameter Vctrl to be the minor steps such as one), and therefore the above equations can be rewritten as follows:

$Vref\_next = Vref\_cur +/- 1$; and $Vctrl\_next = Vctrl\_cur +/- 1$.

For another example, the trimming control circuit 118T can set Adjust=Vstep (e.g. set the respective adjustment steps {Adjust} of the voltage-reference parameter Vref and the voltage-control parameter Vctrl to be the greater steps such as the set of voltage steps Vstep[ref, ctrl], respectively), and therefore the above equations can be rewritten as follows:

$Vref\_next = Vref\_cur +/- Vstep[ref]$; and $Vctrl\_next = Vctrl\_cur +/- Vstep[ctrl]$.

In addition, the count difference threshold Th_diff is typically greater than the maximum count difference Count_diff_max, to allow the trimming control circuit 118T to select one of the setting of "Adjust=1" and the setting of "Adjust=Vstep[ref, ctrl]" according to whether "Count_diff≤Th_diff" is True as shown in FIG. 4.

As the count difference threshold Th_diff can be regarded as a threshold of the count difference Count_diff, and as the trimming control circuit 118T can calculate the absolute value |TCount−Count_Limit| of the difference (TCount−Count_Limit) between the cycle count TCount and the count limit Count_Limit to be the count difference Count_diff, the count difference threshold Th_diff can be a non-negative integer, and more particularly, can be a positive integer. For example, when Count_diff_max=2, the count difference threshold Th_diff is greater than the maximum count difference Count_diff_max such as 2, and therefore can be greater than or equal to 3. For better comprehension, assume that Th_diff=3. In this situation, according to whether "Count_diff≤Th_diff" such as "Count_diff≤3" is True, the trimming control circuit 118T can set Adjust=1 or Adjust=Vstep[ref, ctrl]. For example, when Count_diff=3 (e.g. "Count_diff≤3" is True), the trimming control circuit 118T can set Adjust=1. In some examples, when Count_diff is equal to any of 4, 5, etc. (e.g. "Count_diff≤3" is False), the trimming control circuit 118T can set Adjust=Vstep[ref, ctrl].

TABLE 1

| Reference Clock | 19.2 MHz | 38.4 MHz | 26 MHz | 52 MHz |
|---|---|---|---|---|
| Timeout Count | 192 | 260 | 384 | 520 |

TABLE 2

| | Rate (reference clock) | | |
|---|---|---|---|
| Gear 1 | A (19.2 MHz/ 38.4 MHz/ 26 MHz/ 52 MHz) | B (19.2 MHz/ 38.4 MHz) | B (26 MHz/ 52 MHz) |
| HS-GEAR1 Count Limit | 312 | 364 | 364 |
| HS-GEAR2 Count Limit | 624 | 729 | 728 |
| HS-GEAR3 Count Limit | 1248 | 1459 | 1456 |
| HS-GEAR4 Count Limit | 2496 | 2918 | 2912 |

Table 1 illustrates some examples of the timeout count Timeout_Count with respect to the frequency (e.g. 19.2 MHz, 38.4 MHz, 26 MHz and 52 MHz) of the reference clock Refclk, and Table 2 illustrates some examples of the count limit Count_Limit with respect to the Rate (e.g. Rate A-series and Rate B-series) of the reference clock Refclk and the gear speed Gear_Speed (e.g. HS-GEAR1, HS-GEAR2, HS-GEAR3 and HS-GEAR4), but the present invention is not limited thereto. According to some embodiments, the timeout count Timeout_Count of Table 1 and/or the count limit Count_Limit of Table 2 may vary. According to some embodiments, the measure period may be equal to 10 microseconds.

TABLE 3

| | Rate A-series $f_{ref}$ | Rate B-series $f_{ref}$ | | Rate A-series (from [MIPI-M-PHY]) $f_{ref}$ | Rate B-series[3] (from [MIPI-M-PHY]) $f_{ref}$ | Unit |
|---|---|---|---|---|---|---|
| HS-GEAR | 19.2/26/38.4 | 19.2/38.4 | 26 | 19.2/26/38.4 | | MHz |
| HS-GEAR1 | 1248[2] | 1459.2 | 1456.0 | 1248 | 1457.6 | Mbps |
| HS-GEAR2 | 2496 | 2918.4 | 2912.0 | 2496 | 2915.2 | Mbps |
| HS-GEAR3 | 4992 | 5836.8 | 5824.0 | 4992 | 5830.4 | Mbps |
| HS-GEAR4 | 9984 | 11673.6 | 11648.0 | 9984 | 11660.8 | Mbps |

NOTE 1:
"Mbps" indicates 1000000 bits per second.
NOTE 2:
1248 Mbps with $f_{ref}$ = 38.4 MHz may be obtained using a prescaler, for example, by calculating $f_{ref}$ * M/P, where M = 65 (PLL multiplier), and P = 2 (Prescaler).
NOTE 3:
The B-series rates shown are not integer multiples of common reference frequencies 19.2 MHz or 26 MHz, but are within the tolerance range of 2000 ppm.

Table 3 illustrates an example of HS-Burst Rates. According to an associated specification, the HS-Burst Rates corresponding to the HS-Gears may distribute from 1.46 Gbps (e.g. Gear 1) to 11.6 Gbps (e.g. Gear 4).

Figure 5:
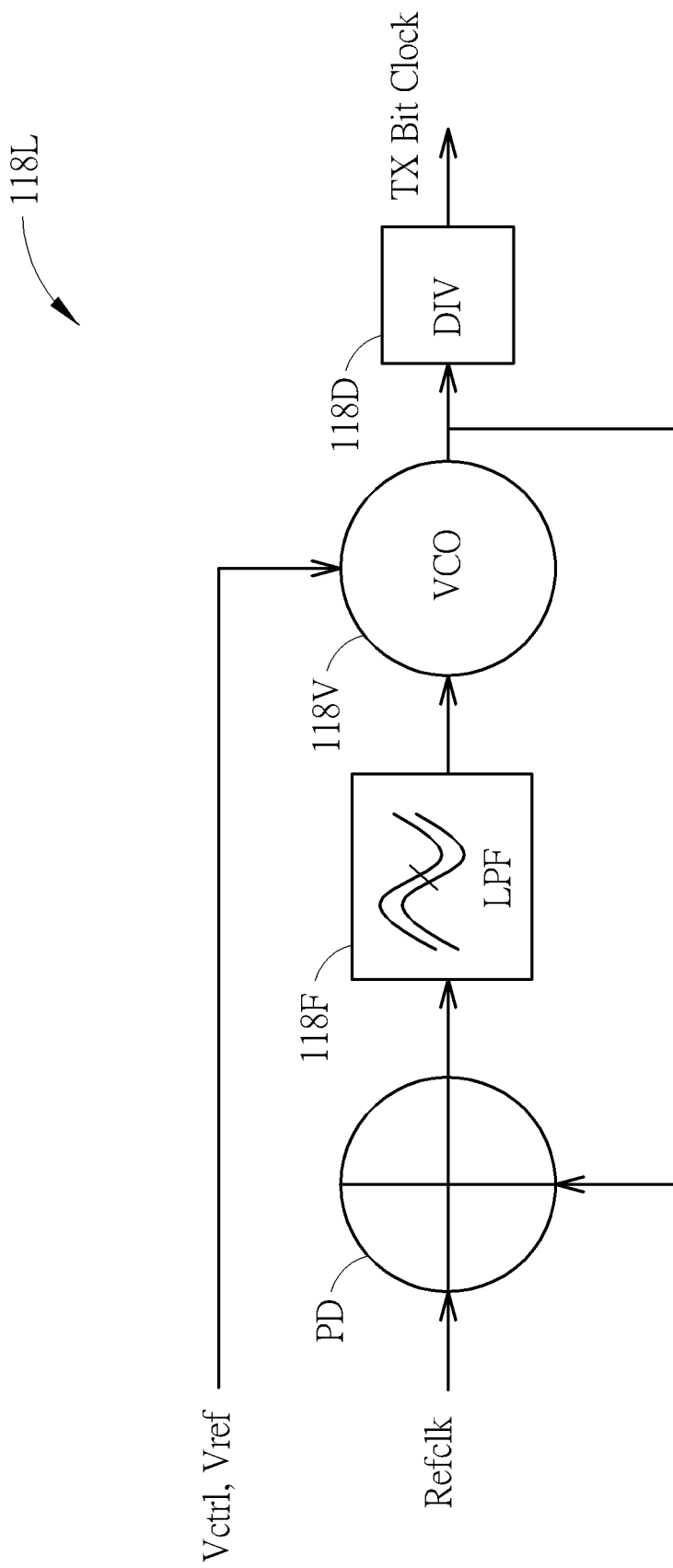
FIG. 5 illustrates an example of a PLL involved with the method.

FIG. 5 illustrates an example of the PLL 118L involved with the method, but the present invention is not limited thereto. In addition to the VCO 118V and the aforementioned frequency divider such as the frequency divider 118D (labeled "DIV" for brevity), the PLL 118L may further comprise a phase detector PD and a low pass filter (LPF) 118F. The VCO 118V can be configured to receive a set of voltage parameters such as the voltage-reference parameter Vref and the voltage-control parameter Vctrl, and fine-tune the control voltage of the VCO 118V according to the set of voltage parameters, to make the frequency of the oscillator output at the output terminal of the VCO 118V correspond to the control voltage. The oscillator output is received by the frequency divider 118D and is sent to an input terminal of the phase detector PD as a feedback signal within the PLL 118L. The phase detector PD can perform phase detection on the oscillator output and the reference clock Refclk to generate a phase detection signal at its output terminal. The LPF 118F can perform low pass filtering on the phase detection signal to generate a filtered result, for being input into the VCO 118V.

Based on the architecture shown in FIG. 1, the memory controller 110 can operate correctly and efficiently according to the method, to allow the data rate of the connection between the host device 50 and the memory device 100 to achieve a high data rate such as 10 Gbps or above while maintaining correctness of data accessing, and therefore enhance the overall performance of the electronic device 10. According to some embodiments, the trimming control circuit 118T can perform the trimming control on the PLL 118L, for supporting the optimization of the PLL 118L that uses the VCXO, where the optimization of the PLL 118L may comprise the parameter adjustment of the PLL 118L (e.g. the voltage parameter adjustment regarding the set of voltage parameters such as the voltage-reference parameter Vref and the voltage-control parameter Vctrl). In addition, the register circuit 118R can store multiple parameters of the PLL 118L, and store multiple processing results of the parameter adjustment of the PLL 118L, where the multiple parameters may comprise multiple control parameters such as the trim-enable parameter Trim_Enable, the count limit Count_Limit, the reference clock selection parameter Refclk_Sel, the gear speed Gear_Speed, the set of voltage steps Vstep[ref, ctrl] (e.g. Vstep[ref] and Vstep[ctrl]), the count difference threshold Th_diff, the timeout count Timeout_Count and the maximum count difference Count_diff_max, and the multiple processing results may comprise the respective resultant values Vref[Result] and Vctrl[Result] of the voltage-reference parameter Vref and the voltage-control parameter Vctrl.

For example, the memory controller 110 can utilize the processing circuit such as the microprocessor 112 to set the multiple control parameters, for controlling the parameter adjustment of the PLL 118L; the memory controller 110 can utilize the trimming control circuit 118T to perform the parameter adjustment of the PLL 118L according to the multiple control parameters, to adjust the set of voltage parameters (e.g. the voltage-reference parameter Vref and the voltage-control parameter Vctrl) among the multiple parameters, for optimizing the control voltage of the VCO 118V, where the control voltage corresponds to the set of voltage parameters, and the oscillation frequency of the VCO corresponds to the control voltage; and during the parameter adjustment of the PLL 118L, in response to at least one predetermined condition of the parameter adjustment of the PLL 118L being satisfied (e.g. the determination result of Step S15 indicates that the cycle count TCount of the TX bit clock counter TCNT falls within the predetermined range such as the target range around the count limit Count_Limit), the memory controller 110 can utilize the trimming control circuit 118T to generate and store the multiple processing results (e.g. the respective resultant values Vref[Result] and Vctrl[Result] of the voltage-reference parameter Vref and the voltage-control parameter Vctrl) in the register circuit 118R, for being sent back to the processing circuit such as the microprocessor 112, to complete the parameter adjustment of the PLL 118L, thereby achieving the on-system PLL management of the memory device 100. For better comprehension, the memory controller 110 can optimize the control voltage with aid of an optimization working flow regarding the control voltage of the VCO 118V (e.g. the working flow shown in FIG. 3). For example, operations of the optimization working flow may comprise:

(1) in Step S11, the memory controller 110 determines whether the memory device 100 is in the power-up phase or the adapt equalization phase to generate a first determination result (e.g. one of the determination results "Yes" and "No" of Step S11);

(2) in Step S12, in response to the first determination result indicating that the memory device 100 is in the power-up phase or the adapt equalization phase, according to the aforementioned at least one predetermined rule, the memory controller 110 determines whether the parameter adjustment of the PLL 118L is needed to generate a second determination result (e.g. one of the determination results "Yes" and "No" of Step S12);

(3) in response to the second determination result indicating that the parameter adjustment of the PLL 118L is needed, the memory controller 110 triggers the parameter adjustment of the PLL 118L with the trim-enable parameter Trim_Enable among the multiple control parameters in Step S13, and more particularly, utilizes the trimming control circuit 118T to perform the parameter adjustment of the PLL 118L in the loop comprising Steps S13-S15 and S16B;

(4) in Step S16A, the memory controller 110 utilizes the trimming control circuit 118T to generate and store the multiple processing results (e.g. the respective resultant values Vref[Result] and Vctrl[Result] of the voltage-reference parameter Vref and the voltage-control parameter Vctrl) in the register circuit 118R, for being sent back to the processing circuit such as the microprocessor 112, to complete the parameter adjustment of the PLL 118L; and (5) in Step S17, after completion of the parameter adjustment of the PLL 118L, the memory controller 110 controls the memory device 100 to enter the idle state of the memory device 100 and stay in the idle state until the any event occurs;

where the any event may represent one of multiple predetermined events, and the multiple predetermined events may comprise the speed mode change and the any host command received from the host device 50.

The memory controller 110 can perform the on-system PLL management, having no need to calibrate the PLL 118L that uses the VCXO with any equipment positioned outside the memory device 100, where the memory controller 110 can optimize the control voltage through performing the on-system PLL management rather than through undergoing any calibration during a manufacturing phase of the memory device 100. In addition, the memory controller 110 can intermittently perform the parameter adjustment of the PLL 118L and access the NV memory 120 in response to one or more host commands (e.g. the any host command such as the write command, the read command, etc.) of the host device 50, and more particularly, can perform at least one portion (e.g. a portion or all) of the following operations:

(1) operation #1: when determining in Step S11 that the memory device 100 is in the power-up phase, triggering the parameter adjustment of the PLL 118L, for example, by setting the trim-enable parameter Trim_Enable in Step S12 to enter Step S13;

(2) operation #2: when determining in Step S11 that the memory device 100 is in the adapt equalization phase, triggering the parameter adjustment of the PLL 118L, for example, by setting the trim-enable parameter Trim_Enable in Step S12 to enter Step S13;

(3) operation #3: when receiving the write command from the host device 50, accessing the NV memory 120, for example, by writing the data carried by the write command into the NV memory 120; and (4) operation #4: when receiving the read command from the host device 50, accessing the NV memory 120, for example, by reading the stored data from the NV memory 120 and providing the host device 50 with this data;

where any operation of the operations #2, #3 and #4 can be performed one or more times, and the operations #2, #3 and #4 can be performed in arbitrary order in response to the respective triggering events of the operations #2, #3 and #4. For example, when there is a need (e.g. the partial working flow from Step S11 to Step S12 and the partial working flow from Step S12 to Step S13), the memory controller 110 can perform the parameter adjustment of the PLL 118L (e.g. the partial working flows in the loop comprising Steps S13-S15 and S16B). For brevity, similar descriptions for these embodiments are not repeated in detail here.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for performing on-system phase-locked loop (PLL) management in a memory device, the method being applied to a memory controller of the memory device, the memory device comprising the memory controller and a non-volatile (NV) memory, the NV memory comprising at least one NV memory element, the method comprising:

utilizing a processing circuit within the memory controller to set multiple control parameters among multiple parameters stored in a register circuit of a transmission interface circuit within the memory controller, for controlling parameter adjustment of a PLL of the transmission interface circuit;

utilizing the transmission interface circuit to perform the parameter adjustment of the PLL according to the multiple control parameters, to adjust a set of voltage parameters among the multiple parameters, for optimizing a control voltage of a voltage controlled oscillator (VCO) in the PLL, wherein the control voltage corresponds to the set of voltage parameters, and an oscillation frequency of the VCO corresponds to the control voltage; and during the parameter adjustment of the PLL, in response to at least one predetermined condition of the parameter adjustment of the PLL being satisfied, utilizing the transmission interface circuit to generate and store multiple processing results in the register circuit, for being sent back to the processing circuit, to complete the parameter adjustment of the PLL, thereby achieving the on-system PLL management of the memory device;

wherein the memory controller optimizes the control voltage with aid of an optimization working flow regarding the control voltage of the VCO; and operations of the optimization working flow comprise:

determining whether the memory device is in a power-up phase or an adapt equalization phase to generate a first determination result;

in response to the first determination result indicating that the memory device is in the power-up phase or the adapt equalization phase, according to at least one predetermined rule, determining whether the parameter adjustment of the PLL is needed to generate a second determination result;

in response to the second determination result indicating that the parameter adjustment of the PLL is needed, triggering the parameter adjustment of the PLL with a trim-enable parameter among the multiple control parameters;

generating and storing the multiple processing results in the register circuit, for being sent back to the processing circuit, to complete the parameter adjustment of the PLL; and after completion of the parameter adjustment of the PLL, controlling the memory device to enter an idle state of the memory device and stay in the idle state until any event occurs.

2. The method of claim 1, wherein the memory controller intermittently performs the parameter adjustment of the PLL and accesses the NV memory in response to one or more host commands of a host device.

3. The method of claim 1, wherein the any event represents one of multiple predetermined events, and the multiple predetermined events comprise a speed mode change and any host command received from a host device.

4. The method of claim 1, wherein in a first case that the any event represents a write command from a host device, the memory controller stores data into the NV memory for the host device in response to the write command from the host device, and controls the memory device to enter the idle state again after completing processing corresponding to the write command, wherein the processing corresponding to the write command comprises writing the data into the NV memory.

5. The method of claim 4, wherein in a second case that the any event represents a read command from the host device, the memory controller reads the stored data from the NV memory in response to the read command from the host device, and provides the host device with said stored data read from the NV memory, and controls the memory device to enter the idle state again after completing processing corresponding to the read command, wherein the processing corresponding to the read command comprises reading the stored data and providing the host device with said stored data.

6. The method of claim 1, wherein in a second case that the any event represents a read command from a host device, the memory controller reads stored data from the NV memory in response to the read command from the host device, and provides the host device with said stored data read from the NV memory, and controls the memory device to enter the idle state again after completing processing corresponding to the read command, wherein the processing corresponding to the read command comprises reading the stored data and providing the host device with said stored data.

7. A memory device, comprising:
a non-volatile (NV) memory, arranged to store information, wherein the NV memory comprises at least one NV memory element; and
a memory controller, coupled to the NV memory, arranged to control operations of the memory device, wherein the memory controller comprises:
  a processing circuit, arranged to control the memory controller according to a plurality of host commands from a host device, to allow the host device to access the NV memory through the memory controller; and
  a transmission interface circuit, coupled to the processing circuit, arranged to perform communications with the host device, wherein the transmission interface circuit comprises:
    a phase-locked loop (PLL); and
    a register circuit, arranged to store multiple parameters of the PLL, and store multiple processing results of parameter adjustment of the PLL, wherein the multiple parameters comprise multiple control parameters;
  wherein:
    the memory controller utilizes the processing circuit to set the multiple control parameters, for controlling the parameter adjustment of the PLL;
    the memory controller utilizes the transmission interface circuit to perform the parameter adjustment of the PLL according to the multiple control parameters, to adjust a set of voltage parameters among the multiple parameters, for optimizing a control voltage of a voltage controlled oscillator (VCO) in the PLL, wherein the control voltage corresponds to the set of voltage parameters, and an oscillation frequency of the VCO corresponds to the control voltage; and
    during the parameter adjustment of the PLL, in response to at least one predetermined condition of the parameter adjustment of the PLL being satisfied, the memory controller utilizes the transmission interface circuit to generate and store the multiple processing results in the register circuit, for being sent back to the processing circuit, to complete the parameter adjustment of the PLL, thereby achieving on-system PLL management of the memory device;
  wherein the memory controller optimizes the control voltage with aid of an optimization working flow regarding the control voltage of the VCO; and operations of the optimization working flow comprise:
    determining whether the memory device is in a power-up phase or an adapt equalization phase to generate a first determination result;
    in response to the first determination result indicating that the memory device is in the power-up phase or the adapt equalization phase, according to at least one predetermined rule, determining whether the parameter adjustment of the PLL is needed to generate a second determination result;
    in response to the second determination result indicating that the parameter adjustment of the PLL is needed, triggering the parameter adjustment of the PLL with a trim-enable parameter among the multiple control parameters;
    generating and storing the multiple processing results in the register circuit, for being sent back to the processing circuit, to complete the parameter adjustment of the PLL; and
    after completion of the parameter adjustment of the PLL, controlling the memory device to enter an idle state of the memory device and stay in the idle state until any event occurs.

8. An electronic device comprising the memory device of claim 7, and further comprising:
the host device, coupled to the memory device, wherein the host device comprises:
  at least one processor, arranged for controlling operations of the host device; and
  a power supply circuit, coupled to the at least one processor, arranged for providing power to the at least one processor and the memory device;
wherein the memory device provides the host device with storage space.

9. A memory controller of a memory device, the memory device comprising the memory controller and a non-volatile (NV) memory, the NV memory comprising at least one NV memory element, the memory controller comprising:
- a processing circuit, arranged to control the memory controller according to a plurality of host commands from a host device, to allow the host device to access the NV memory through the memory controller; and
- a transmission interface circuit, coupled to the processing circuit, arranged to perform communications with the host device, wherein the transmission interface circuit comprises:
    - a phase-locked loop (PLL); and
    - a register circuit, arranged to store multiple parameters of the PLL, and store multiple processing results of parameter adjustment of the PLL, wherein the multiple parameters comprise multiple control parameters;

wherein:
- the memory controller utilizes the processing circuit to set the multiple control parameters, for controlling the parameter adjustment of the PLL;
- the memory controller utilizes the transmission interface circuit to perform the parameter adjustment of the PLL according to the multiple control parameters, to adjust a set of voltage parameters among the multiple parameters, for optimizing a control voltage of a voltage controlled oscillator (VCO) in the PLL, wherein the control voltage corresponds to the set of voltage parameters, and an oscillation frequency of the VCO corresponds to the control voltage; and
- during the parameter adjustment of the PLL, in response to at least one predetermined condition of the parameter adjustment of the PLL being satisfied, the memory controller utilizes the transmission interface circuit to generate and store the multiple processing results in the register circuit, for being sent back to the processing circuit, to complete the parameter adjustment of the PLL, thereby achieving on-system PLL management of the memory device;

wherein the memory controller optimizes the control voltage with aid of an optimization working flow regarding the control voltage of the VCO; and operations of the optimization working flow comprise:
- determining whether the memory device is in a power-up phase or an adapt equalization phase to generate a first determination result;
- in response to the first determination result indicating that the memory device is in the power-up phase or the adapt equalization phase, according to at least one predetermined rule, determining whether the parameter adjustment of the PLL is needed to generate a second determination result;
- in response to the second determination result indicating that the parameter adjustment of the PLL is needed, triggering the parameter adjustment of the PLL with a trim-enable parameter among the multiple control parameters;
- generating and storing the multiple processing results in the register circuit, for being sent back to the processing circuit, to complete the parameter adjustment of the PLL; and
- after completion of the parameter adjustment of the PLL, controlling the memory device to enter an idle state of the memory device and stay in the idle state until any event occurs.

* * * * *